United States Patent
Kim et al.

(10) Patent No.: US 7,782,685 B2
(45) Date of Patent: Aug. 24, 2010

(54) SEMICONDUCTOR DEVICE AND OPERATING METHOD THEREOF

(75) Inventors: Ki-Ho Kim, Kyoungki-do (KR); Chang-Ho Do, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 225 days.

(21) Appl. No.: 12/164,167

(22) Filed: Jun. 30, 2008

(65) Prior Publication Data

US 2009/0273992 A1  Nov. 5, 2009

(30) Foreign Application Priority Data

Apr. 30, 2008  (KR) .................. 10-2008-0040347

(51) Int. Cl.
*G11C 7/00* (2006.01)
(52) U.S. Cl. .............. 365/193; 365/189.02; 365/189.03
(58) Field of Classification Search .................. 365/193, 365/189.02, 189.03
See application file for complete search history.

(56) References Cited

U.S. PATENT DOCUMENTS 5,883,843 A * 3/1999 Hii et al. ..................... 365/201
6,947,334 B2 * 9/2005 Shin ....................... 365/189.16

FOREIGN PATENT DOCUMENTS

| KR | 1019990010047 A | 2/1999 |
| KR | 1020040084472 A | 10/2004 |
| KR | 1020050064036 A | 6/2005 |
| KR | 1020050067813 A | 7/2005 |

OTHER PUBLICATIONS

Notice of Allowance issued from Korean Intellectual Property Office on Oct. 23, 2009.

* cited by examiner

*Primary Examiner*—Tuan T. Nguyen
(74) *Attorney, Agent, or Firm*—IP & T Law Firm PLC

(57) ABSTRACT

A semiconductor device includes a pad configured to receive a data strobe signal, and a path selector configured to output the data strobe signal through a corresponding input path during a normal operation, and to output the data strobe signal through a plurality of input paths in response to a path selection signal during a test operation.

34 Claims, 3 Drawing Sheets

SEMICONDUCTOR DEVICE AND OPERATING METHOD THEREOF

CROSS-REFERENCE TO RELATED APPLICATION

The present invention claims priority of Korean patent application number 2008-0040347, filed on Apr. 30, 2008, which is incorporated by reference in its entirety.

BACKGROUND OF THE INVENTION

The present invention relates to semiconductor design technology, and more particularly, to a semiconductor device to which a data strobe signal is applied through a predetermined pad during a test operation, and an operating method thereof.

Generally, a semiconductor device such as a double data rate (DDR) synchronous dynamic random access memory (SDRAM) uses a data strobe signal in order to synchronize data input and output. The data strobe signal is used for resolving a data recognition error originated from a speed difference caused by a data bus connected to an external chipset. The data strobe signal is used to synchronize input data transferred from the external chipset during a write operation, and used to synchronize output data transferred to the external chipset during a read operation. That is, the data strobe signal is a signal for guaranteeing a set-up time and a hold time of data input and output. Generally, a data strobe signal includes a pair of a positive data strobe signal and a negative data strobe signal.

Meanwhile, a semiconductor device is designed to operate according to a data width option. The data width option is an option by which a user can set a desired data width and is defined by a specification. For example, when a data width option is set to x16 in a semiconductor device having sixteen data input/output pads, data input/output operations are performed through the sixteen data input/output pads. When the data width option is set to x8, data input/output operations are performed through corresponding eight data input/output pads of the sixteen data input/output pads.

The data width option can be set in a mode register set provided inside the semiconductor device. For reference, in addition to the data width option, a column address strobe (CAS) latency, a burst type, and a burst length are also set in the mode register set. Information regarding an additional operation can be set in the mode register set.

Meanwhile, as the process technology of a semiconductor device rapidly develops, the number of data input/output pads increases and accordingly the number of pads to which positive/negative data strobe signals are applied also increases. The number of pads to which positive/negative data strobe signals are applied is designed to correspond to a predetermined number of data input/output pads. For example, a pair of pads receiving a pair of positive/negative data strobe signals is designed to correspond to eight data input/output pads. That is, two pairs of pads receiving two pairs of positive/negative strobe signals can be designed in a semiconductor device having sixteen data input/output pads.

FIG. 1 is a block diagram explaining a transmission path of a data strobe signal in a partial construction of a conventional semiconductor device. A semiconductor device having sixteen data input/output pads (not shown) is exemplarily described for convenience in explanation. That is, two pairs of pads receiving two pairs of positive/negative data strobe signals are designed.

FIG. 1 illustrates first to fourth pads 110_1, 110_2, 110_3 and 110_4, and first to fourth differential input buffers 130_1, 130_2, 130_3 and 130_4.

The first and second pads 110_1 and 110_2 receive a first positive data strobe signal DQS1 and a first negative data strobe signal DQS1B, respectively. The third and fourth pads 110_3 and 110_4 receive a second positive data strobe signal DQS2 and a second negative data strobe signal DQS2B, respectively. The first positive data strobe signal DQS1 and the first negative data strobe signal DQS1B form a pair, and the second positive data strobe signal DQS2 and the second negative data strobe signal DQS2B form a pair.

FIG. 2 is a waveform diagram explaining the waveform of each data strobe signal of FIG. 1.

FIG. 2 illustrates a first positive data strobe signal DQS1, a first negative data strobe signal DQS1B, a second positive data strobe signal DQS2, and a second negative data strobe signal DQS2B.

The first positive data strobe signal DQS1 and the first negative data strobe signal DQS1B have phases opposite to each other, respectively, and the second positive data strobe signal DQS2 and the second negative data strobe signal DQS2B have phases opposite to each other, respectively. The first positive data strobe signal DQS1 and the second positive data strobe signal DQS2 are input with the same phase.

Referring to FIG. 1 again, the first differential input buffer 130_1 receives differential first positive data strobe signal DQS1 and first negative data strobe signal DQS1B to perform buffering and output an output signal corresponding to the first positive data strobe signal DQS1 as a first positive output signal OUT_DQS1. The second differential input buffer 130_2 receives differential first positive data strobe signal DQS1 and first negative data strobe signal DQS1B to perform buffering and output an output signal corresponding to the first negative data strobe signal DQS1B as a first negative output signal OUT_DQS1B. The third differential input buffer 130_3 receives differential second positive data strobe signal DQS2 and second negative data strobe signal DQS2B to perform buffering and output an output signal corresponding to the second positive data strobe signal DQS2 as a second positive output signal OUT_DQS2. The fourth differential input buffer 130_4 receives differential second positive data strobe signal DQS2 and second negative data strobe signal DQS2B to perform buffering and output an output signal corresponding to the second negative data strobe signal DQS2B as a second negative output signal OUT_DQS2B.

That is, the first positive/negative strobe signals DQS1 and DQS1B become the first positive/negative output signals OUT_DQS1 and OUT_DQS1B through the buffering operation. Also, the second positive/negative strobe signals DQS2 and DQS2B become the second positive/negative output signals OUT_DQS2 and OUT_DQS2B through the buffering operation. These operations are likewise performed during a normal operation and a test operation.

Meanwhile, a test equipment having a plurality of test pins is used to test a semiconductor device. For convenience in description, only connecting test pins to a pad related to a data strobe signal is considered. That is, for testing a conventional semiconductor device, the test equipment should assign four test pins corresponding to four pads. In other words, the test equipment applies first and second positive/negative strobe signals DQS1, DQS1B, DQS2 and DQS2B to the first to fourth pads 110_1, 110_2, 110_3 and 110_4, and the semiconductor device receives these signals, so that a test operation is performed.

If the number of data strobe signals applied to the semiconductor device increases, the number of pads receiving these signals should increase and the number of test pins that should be assigned to the increased number of the pads during a test operation should also increase. Consequently, the number of semiconductor devices that can be tested at a time reduces in an aspect of the test equipment with a limited number of test pins. The reduction in the number of semiconductor devices that can be tested at a time means a time taken to test a scheduled number of semiconductor devices becomes long, which increases a product price and thus reduces the competitiveness of the product.

SUMMARY OF THE INVENTION

Embodiments of the present invention are directed to providing a semiconductor device that can be tested using a minimum number of test pins even when the number of data strobe signals used during a normal test operation increases.

Embodiments of the present invention are also directed to providing a semiconductor device that can output a data strobe signal applied through a predetermined pad during a test operation to a desired input path according to a data width option.

In accordance with an aspect of the present invention, there is provided a semiconductor device, including: a pad configured to receive a data strobe signal; and a path selector configured to output the data strobe signal through a corresponding input path during a normal operation, and to output the data strobe signal through a plurality of input paths in response to a path selection signal during a test operation.

In accordance with another aspect of the present invention, there is provided a semiconductor device, including: a first pad configured to receive a positive data strobe signal; and a path selector configured to output the positive data strobe signal through a first positive input path during a normal operation, and to output the positive data strobe signal through the first positive input path, or through the first positive input path and a second positive input path in response to a path selection signal during a test operation.

In accordance with another aspect of the present invention, there is provided a semiconductor device, including: a first pad configured to receive a first positive data strobe signal; a second pad configured to receive a second positive data strobe signal; and a path selector configured to output the first and second data strobe signals through first and second input paths during a normal operation, and selectively output the first or second data strobe signal through first or second positive input paths, or output the first and second data strobe signals through the first and second positive input paths in response to first and second path selection signals during a test operation.

In accordance with another aspect of the present invention, there is provided a method for operating a semiconductor device, the method including: outputting a data strobe signal applied to a pad through a corresponding input path during a normal operation; and allowing the data strobe signal applied to the pad to be shared by a plurality of input paths in response to a path selection signal during a test operation.

Generally, a semiconductor device passes through various tests before it is sold to a consumer. Meanwhile, as the process technology of a semiconductor device rapidly develops, the number of data input/output pads increases and accordingly the number of pad to which positive/negative data strobe signals are applied also increases. Therefore, the number of test pins for testing the pads increases to correspond the number of data strobe signals used during a normal operation. Consequently, the increase in the number of the test pins acts as a factor raising the price of the semiconductor device to reduce price competitiveness compared with those of other competitive companies. To eliminate this limitation, the present invention allows data strobe signals to be applied using a minimum number of pads and to be shared by a plurality of input paths during a test operation. Therefore, even when the number of data strobe signals used during a normal operation increases, the test operation can be performed using a minimum number of test pins. Furthermore, even when a data strobe signal is applied through a predetermined pad, a test operation can be performed according to a data width option.

DESCRIPTION OF SPECIFIC EMBODIMENTS

Hereinafter, a semiconductor device and an operation method thereof in accordance with the present invention will be described in detail with reference to the accompanying drawings.

Figure 3:
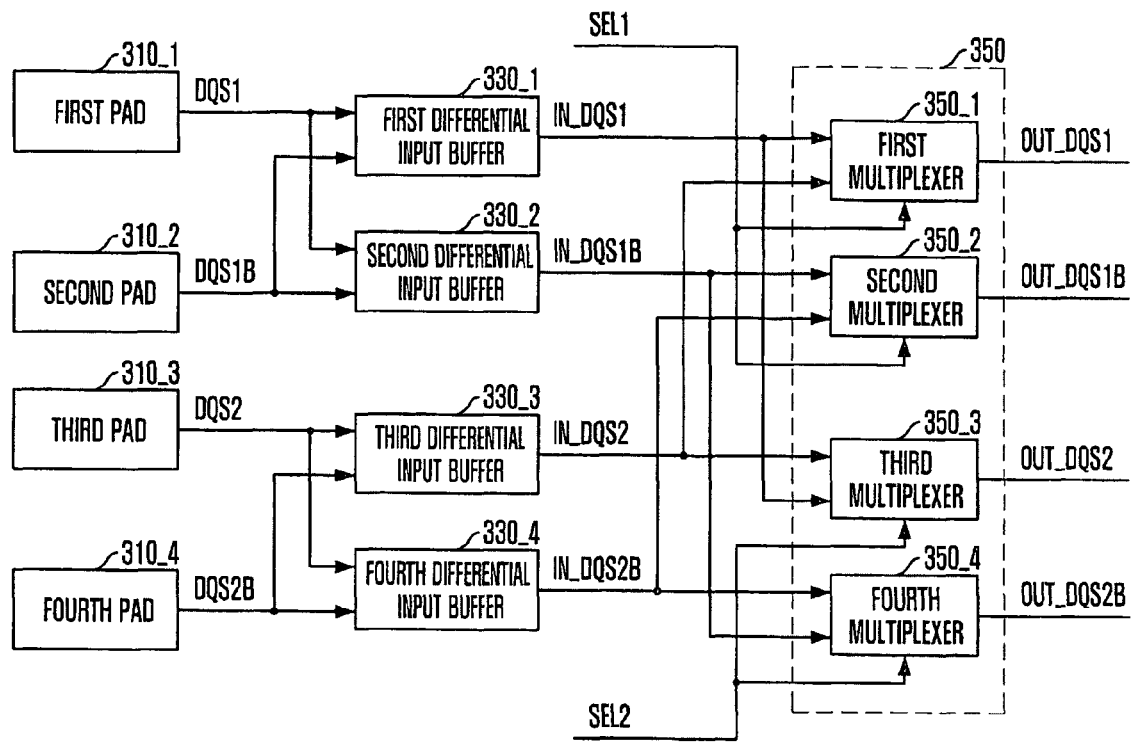
FIG. 3 is a block diagram explaining a transmission path of a data strobe signal in a partial construction of a semiconductor device in accordance with the present invention.

FIG. 3 is a block diagram explaining a transmission path of a data strobe signal in a partial construction of a semiconductor device in accordance with the present invention. For convenience in description, it is assumed that first and second positive/negative data strobe signals DQS1, DQS1B, DQS2 and DQS2B are input through four pads during a normal operation.

A circuit construction related to the normal operation is described.

FIG. 3 illustrates first to fourth pads 310_1, 310_2, 310_3 and 310_4, and first to fourth differential input buffers 330_1, 330_2, 330_3 and 330_4, and a path selector 350.

The first and second pads 310_1 and 310_2 can receive a first positive data strobe signal DQS1 and a first negative data strobe signal DQS1B, respectively. The third and fourth pads 310_3 and 310_4 can receive a second positive data strobe signal DQS2 and a second negative data strobe signal DQS2B, respectively.

Figure 1:
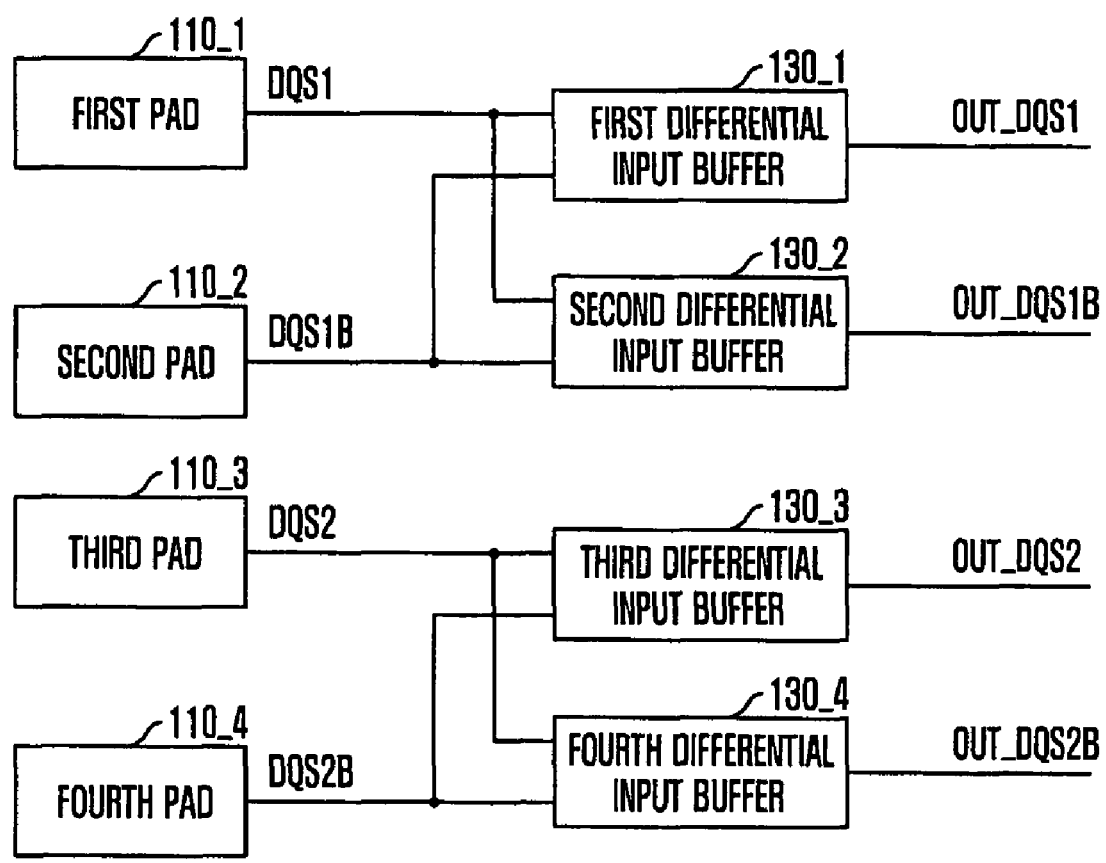
FIG. 1 is a block diagram explaining a transmission path of a data strobe signal in a partial construction of a conventional semiconductor device.
Figure 2:
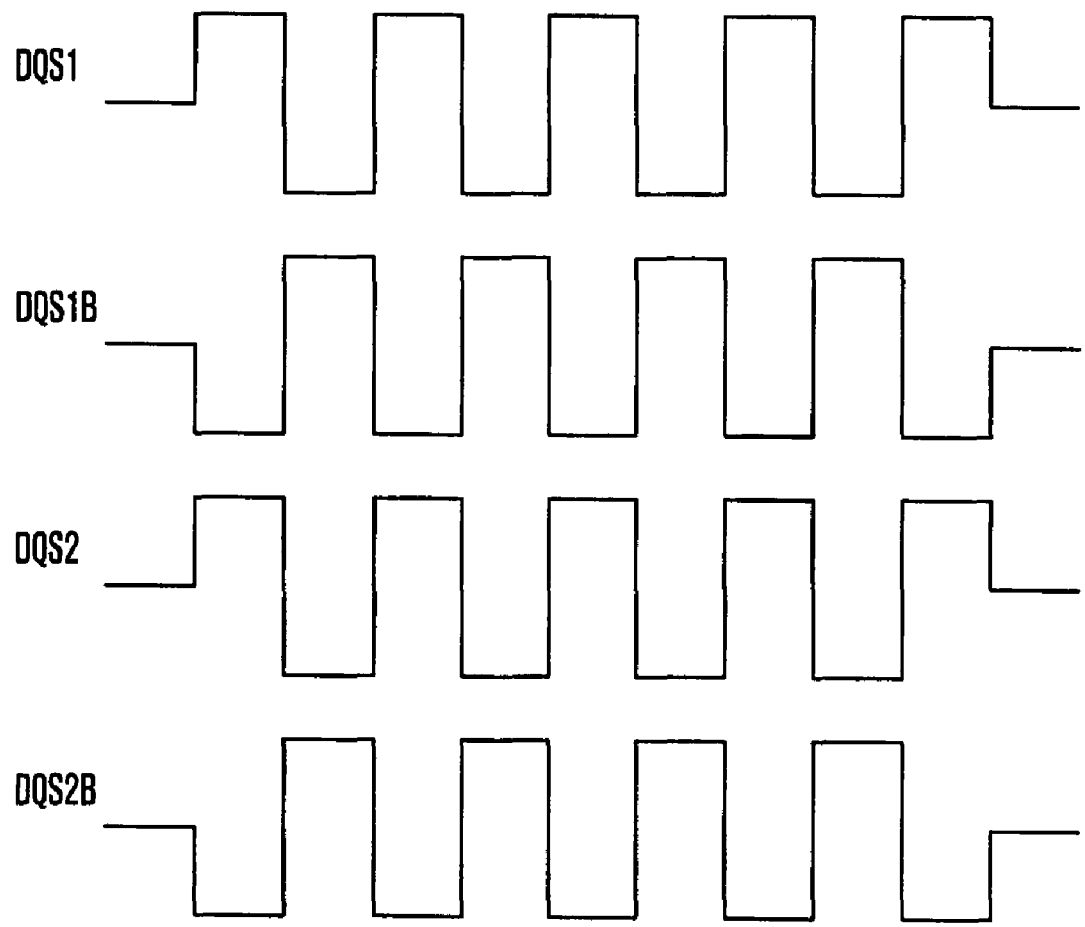
FIG. 2 is a waveform diagram explaining the waveform of each data strobe signal of FIG. 1.

During a normal operation, the first positive data strobe signal DQS1 and the first negative data strobe signal DQS1B applied from an external chipset can have respective phases that are opposite to each other, and also the second positive data strobe signal DQS2 and the second negative data strobe signal DQS2B can have respective phases that are opposite to each other. The first positive data strobe signal DQS1 and the second positive data strobe signal DQS2 can have the same phase. That is, these signals are illustrated in the waveform diagram of FIG. 2. Referring to FIG. 2, the first positive data strobe signal DQS1 and the second positive data strobe signal DQS2 have the same waveform, and the first negative data strobe signal DQS1B and the second negative data strobe signal DQS2B have the same waveform.

Meanwhile, the first differential input buffer 330_1 can receive differential first positive data strobe signal DQS1 and first negative data strobe signal DQS1B to perform buffering and output an output signal corresponding to the first positive data strobe signal DQS1 as a first positive input signal IN_DQS1. The second differential input buffer 330_2 can receive differential first positive data strobe signal DQS1 and first negative data strobe signal DQS1B to perform buffering and output an output signal corresponding to the first negative data strobe signal DQS1B as a first negative input signal IN_DQS1B. The third differential input buffer 330_3 can receive differential second positive data strobe signal DQS2 and second negative data strobe signal DQS2B to perform buffering and output an output signal corresponding to the second positive data strobe signal DQS2 as a second positive input signal IN_DQS2. The fourth differential input buffer 330_4 can receive differential second positive data strobe signal DQS2 and second negative data strobe signal DQS2B to perform buffering and output an output signal corresponding to the second negative data strobe signal DQS2B as a second negative input signal IN_DQS2B.

That is, during the normal operation, the first positive/negative strobe signals DQS1 and DQS1B can become the first positive/negative input signals IN_DQS1 and IN_DQS1B through the buffering operation. Also, the second positive/negative strobe signals DQS2 and DQS2B can become the second positive/negative input signals IN_DQS2 and IN_DQS2B through the buffering operation.

Meanwhile, the path selector 350 is designed to output the first positive/negative input signals IN_DQS1 and IN_DQS1B and the second positive/negative input signals IN_DQS2 and IN_DQS2B through corresponding input paths in response to first and second path selection signals SEL1 and SEL2. The path selector 350 can include first to fourth multiplexers 350_1, 350_2, 350_3 and 350_4.

The first multiplexer 350_1 can receive the first positive input signal IN_DQS1 and the second positive input signal IN_DQS2, and output the first positive input signal IN_DQS1 as a first positive output signal OUT_DQS1 or output the second positive input signal IN_DQS2 as a first positive output signal OUT_DQS1, in response to the first path selection signal SEL1.

The second multiplexer 350_2 can receive the first negative input signal IN_DQS1B and the second negative input signal IN_DQS2B, and output the first negative input signal IN_DQS1B as a first negative output signal OUT_DQS1B or output the second negative input signal IN_DQS2B as a first negative output signal OUT_DQS1B, in response to the first path selection signal SEL1.

The third multiplexer 350_3 can receive the first positive input signal IN_DQS1 and the second positive input signal IN_DQS2, and output the first positive input signal IN_DQS1 as a second positive output signal OUT_DQS2 or output the second positive input signal IN_DQS2 as a second positive output signal OUT_DQS2 in response to the second path selection signal SEL2.

The second multiplexer 350_4 can receive the first negative input signal IN_DQS1B and the second negative input signal IN_DQS2B and output the first negative input signal IN_DQS1B as a second negative output signal OUT_DQS2B or output the second negative input signal IN_DQS2B as a second negative output signal OUT_DQS2B in response to the second path selection signal SEL2.

During a normal operation, the first multiplexer 350_1 outputs the first positive input signal IN_DQS1 as the first positive output signal OUT_DQS1 through a first positive input path, the second multiplexer 350_2 outputs the first negative input signal IN_DQS1B as the first negative output signal OUT_DQS1B through a first negative input path, the third multiplexer 350_3 outputs the second positive input signal IN_DQS2 as the second positive output signal OUT_DQS2 through a second positive input path, and the fourth multiplexer 350_4 outputs the second negative input signal IN_DQS2B as the second negative output signal OUT_DQS2B through a second negative input path.

The first positive input path can mean a path through which the first positive output signal OUT_DQS1 is transferred, the first negative input path can mean a path through which the first negative output signal OUT_DQS1B is transferred, the second positive input path can mean a path through which the second positive output signal OUT_DQS2 is transferred, and the second negative input path can mean a path through which the second negative output signal OUT_DQS2B is transferred.

The above-described operations can be operations in x16 data width option. In case of x8 data width option, the first positive/negative data strobe signals DQS1 and DQS1B are received through the first and second pads 310_1 and 310_2 and buffered, so that the first positive/negative output signals OUT_DQS1 and OUT_DQS1B are output through the first positive/negative input paths, or the second positive/negative data strobe signals DQS2 and DQS2B are received through the third and fourth pads 310_3 and 310_4 and buffered, so that the second positive/negative output signals OUT_DQS2 and OUT_DQS2B are output through the second positive/negative input paths.

Hereinafter, a test operation is described in accordance with the present invention. For convenience in description, it is assumed that the first positive/negative data strobe signals DQS1 and DQS1B are applied from two test pins to the first and second pads 310_1 and 310_2.

The first positive/negative data strobe signals DQS1 and DQS1B are buffered at the first and second differential input buffers 330_1 and 330_2 and then output as the first positive/negative input signals IN_DQS1 and IN_DQS1B. The path selector 350 can output the first positive/negative input signals IN_DQS1 and IN_DQS1B as the first positive/negative output signals OUT_DQS1 and OUT_DQS1B through the first positive/negative input path, or output the first and second positive/negative output signals OUT_DQS1, OUT_DQS1B, OUT_DQS2 and OUT_DQS2B through the first and second positive/negative input paths in response to the first and second path selection signals SEL1 and SEL2. That is, the first positive/negative data strobe signals DQS1 and DQS1B are applied through a pair of first and second pads 310_1 and 310_2, so that the first and second positive/negative output signals OUT_DQS1, OUT_DQS1B, OUT_DQS2 and OUT_DQS2B can be output.

When the second positive/negative data strobe signals DQS2 and DQS2B are received through the third and fourth pads 310_3 and 310_4, the path selector 350 can output the second positive/negative input signals IN_DQS2 and IN_DQS2B as the second positive/negative output signals OUT_DQS2 and OUT_DQS2B through the second positive/negative input paths, or can output the first and second positive/negative output signals OUT_DQS1, OUT_DQS1B, OUT_DQS2 and OUT_DQS2B through the first and second positive/negative input paths, in response to the first and second path selection signals SEL1 and SEL2. That is, the second positive/negative data strobe signals DQS2 and DQS2B are applied through a pair of third and fourth pads 310_3 and 310_4 so that the first and second positive/negative output signals OUT_DQS1, OUT_DQS1B, OUT_DQS2 and OUT_DQS2B can be output.

Consequently, the semiconductor device in accordance with the present invention can perform the same test operation using a minimum number of test pins during a test operation even when the number of data strobe signals increases during a normal operation.

Meanwhile, the first and second path selection signals SEL1 and SEL2 can be signals corresponding to the normal operation and the test operation of the semiconductor device. That is, during the normal operation, the first and second positive/negative data strobe signals can be applied through fourth pads, so that the first and second positive/negative output signals OUT_DQS1, OUT_DQS1B, OUT_DQS2 and OUT_DQS2B can be generated. During the test operation, positive/negative data strobe signals can be applied to the first and second pads 310_1 and 310_2 through a minimum number of test pins, so that the first and second positive/negative output signals OUT_DQS1, OUT_DQS1B, OUT_DQS2 and OUT_DQS2B can be generated in response to the first and second path selection signals SEL1 and SEL2.

Also, the first and second path selection signals SEL1 and SEL2 can be signals corresponding to the data width option information of the semiconductor device. That is, when a test operation with the x8 data width option is performed, positive/negative data strobe signals can be applied to the first and second pads 310_1 and 310_2, so that the first positive/negative output signals OUT_DQS1 and OUT_DQS1B can be generated or the second positive/negative output signals OUT_DQS2 and OUT_DQS2B can be generated in response to the first and second path selection signals SEL1 and SEL2. When the test operation is performed with the x16 data width option, positive/negative data strobe signals can be applied to the first and second pads 310_1 and 310_2, so that the first and second positive/negative output signals OUT_DQS1, OUT_DQS1B, OUT_DQS2 and OUT_DQS2B can be generated in response to the first and second path selection signals SEL1 and SEL2.

The first and second selection signals SEL1 and SEL2 can be signals provided by the mode register set, and can be signals generated inside depending on a data width option and a test operation.

As described above, during a normal operation, the semiconductor device in accordance with the present invention can receive the first and second positive/negative data strobe signals DQS1, DQS1B, DQS2 and DQS2B through the first to fourth pads 310_1, 310_2, 310_3 and 310_4 from an external chipset to output the first and second positive/negative output signals OUT_DQS1, OUT_DQS1B, OUT_DQS2 and OUT_DQS2B through respective corresponding input paths when a data width option is x16. When the data width option is x8, the semiconductor device can receive positive/negative data strobe signals through the first and second pads 310_1 and 310_2 or third and fourth pads 310_3 and 310_4 to output the first positive/negative output signals OUT_DQS1 and OUT_DQS1B, or output the second positive/negative output signals OUT_DQS2 and OUT_DQS2B.

Also, during a test operation, the semiconductor device in accordance with the present invention can receive positive/negative data strobe signals through the first and second pads 310_1 and 310_2 or third and fourth pads 310_3 and 310_4 from a test equipment to output the first and second positive/negative output signals OUT_DQS1, OUT_DQS1B, OUT_DQS2 and OUT_DQS2B in response to the first and second path selection signals SEL1 and SEL2 when the data width option is x16. When the data width option is x8, the semiconductor device can receive positive/negative data strobe signals through the first and second pads 310_1 and 310_2 or third and fourth pads 310_3 and 310_4 to output the first positive/negative output signals OUT_DQS1, OUT_DQS1B or second positive/negative output signals OUT_DQS2 and OUT_DQS2B in response to the first and second path selection signals SEL1 and SEL2.

That is, the semiconductor device in accordance with the present invention can output a data strobe signal applied to an arbitrary pad through a corresponding input path during a normal operation, and allows a data strobe signal applied to an arbitrary pad to be shared by a plurality of input paths in response to a path selection signal during a test operation. Therefore, even when the number of data strobe signals used during the normal operation increases, positive/negative data strobe signals can be applied through a minimum number of pads, so that the first and second positive/negative output signals OUT_DQS1, OUT_DQS1B, OUT_DQS2 and OUT_DQS2B, and the test operation can be performed using theses signals. The sharing of the data strobe signal by the input path means that a positive data strobe signal is shared and output as the first and second positive output signals OUT_DQS1 and OUT_DQS2, and a negative data strobe signal is shared and output as the first and second negative output signals OUT_DQS1B and OUT_DQS2B.

Also, a data strobe signal in accordance with the present invention can be output through a desired input path according to a path selection signal. In other words, the positive/negative data strobe signals applied through a predetermined pad can be output through a desired input path in response to the first and second path selection signals SEL1 and SEL2, so that the test operation can be performed according to a data width option.

Hereinafter, the first to fourth multiplexers 350_1, 350_2, 350_3 and 350_4 that can be provided to the path selector 350 are described. For convenience of description, the first multiplexer 350_1 is described by way of example.

Figure 4:
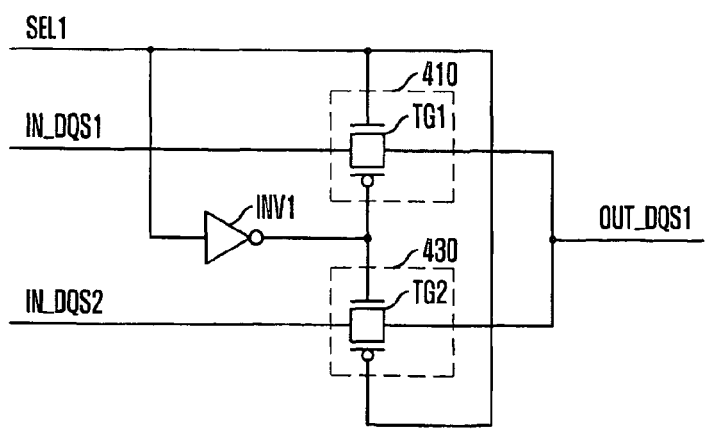
FIG. 4 is a circuit diagram describing the first multiplexer 350_1 of FIG. 3.

FIG. 4 is a circuit diagram describing the first multiplexer 350_1 of FIG. 3.

Referring to FIG. 4, the first multiplexer 350_1 is designed to output the first positive input signal IN_DQS1 or the second positive input signal IN_DQS2 as the first positive output signal OUT_DQS1 in response to the first path selection signal SEL1. The first multiplexer 350_1 can include a first transfer unit 410 and a second transfer unit 430 that response to the first path selection signal SEL1.

The first transfer unit 410 is designed to output the first positive input signal IN_DQS1 as the first positive output signal OUT_DQS1 in response to the first path selection signal SEL1 and an output signal from an inverter INV for inverting the first path selection signal SEL1. The first transfer unit 410 can include a first transfer gate TG1 including a PMOS transistor and an NMOS transistor.

The second transfer unit 430 is designed to output the second positive input signal IN_DQS2 as the first positive output signal OUT_DQS1 in response to the first path selection signal SEL1 and an output signal from the inverter INV. The second transfer unit 430 can include a second transfer gate TG2 including a PMOS transistor and an NMOS transistor.

For example, when the first path selection signal SEL1 has a logic 'high', the first transfer gate TG1 is turned-on and the second transfer gate TG2 is turned-off, so that the first positive input signal IN_DQS1 can be output as the first positive output signal OUT_DQS1. When the first path selection signal SEL1 has a logic 'low', the second transfer gate TG2 is turned-on and the first transfer gate TG1 is turned-off, so that the second positive input signal IN_DQS2 can be output as the first positive output signal OUT_DQS1.

The construction having the two transfer units as illustrated in FIG. 4 is intended for applying the same loading to the first positive/negative output signals OUT_DQS1 and OUT_DQS1B, and the second positive/negative output signals OUT_DQS2 and OUT_DQS2B, and also intended for performing the test operation corresponding to a data width option using positive/negative data strobe signals applied to the first and second pads 310_1 and 310_2 or the third and fourth pads 310_3 and 310_4.

That is, during the x16 data width option test operation, the positive/negative data strobe signals applied through the first and second pads 310_1 and 310_2 can become the first positive/negative output signals OUT_DQS1 and OUT_DQS1B through the first transfer units of the respective first and second multiplexers 350_1 and 350_2 and become the second positive/negative output signals OUT_DQS2 and OUT_DQS2B through the second transfer units of the respective third and fourth multiplexers 350_3 and 350_4. During the x8 data width option test operation, the positive/negative data strobe signals applied through the first and second pads 310_1 and 310_2 can become the first positive/negative output signals OUT_DQS1 and OUT_DQS1B through the first transfer units of the respective first and second multiplexers 350_1 and 350_2, or become the second positive/negative output signals OUT_DQS2 and OUT_DQS2B through the second transfer units of the respective third and fourth multiplexers 350_3 and 350_4. When the third and fourth pads 310_3 and 310_4 are used, the positive/negative data strobe signals applied through the third and fourth pads 310_3 and 310_4 can become the first positive/negative output signals OUT_DQS1 and OUT_DQS1B through the second transfer units of the respective first and second multiplexers 350_1 and 350_2 or become the second positive/negative output signals OUT_DQS2 and OUT_DQS2B through the first transfer units of the respective third and fourth multiplexers 350_3 and 350_4.

When only x16 data width option is used for the test in a semiconductor device having a relatively low operation frequency, the first transfer unit 410 can be omitted.

That is, the positive/negative data strobe signals applied to the first and second pads 310_1 and 310_2 can become the first positive/negative output signals OUT_DQS1 and OUT_DQS1B, and become the second positive/negative output signals OUT_DQS2 and OUT_DQS2B through the second transfer units of the respective third and fourth multiplexers 350_3 and 350_4. Also, the positive/negative data strobe signals applied through the third and fourth pads 310_3 and 310_4 can the second positive/negative output signals OUT_DQS2 and OUT_DQS2B, and become the first positive/negative output signals OUT_DQS1 and OUT_DQS1B through the second transfer units of the respective first and second multiplexers 350_1 and 350_2. That is, even when the first transfer units are omitted in the first to fourth multiplexers 350_1, 350_2, 350_3 and 350_4, respectively, the operation according to the x16 data width option can be performed.

As described above, the semiconductor device in accordance with the present invention can receive the positive/negative data strobe signals through a minimum number of pads to perform a test operation during a test operation. That is, when assigned two test pins, the semiconductor device in accordance with the present invention can perform the test operation. Since the positive data strobe signal and the negative data strobe signal are signals operating in a pair, the semiconductor device should be assigned two test pins. However, assuming that one data strobe signal, not a pair is applied to the semiconductor device, the semiconductor device can be assigned one test pin and perform a test operation.

Receiving data strobe signals through a minimum number of pads during the test operation means the number of test pins that should be assigned by a test equipment to the semiconductor device reduces. Therefore, the number of semiconductor devices that can be tested at a time can be increased, and thus time taken to test a scheduled number of semiconductor devices can be reduced. Consequently, since test time is reduced, the product price also can be reduced.

Also, even when data strobe signals are applied using a predetermined number of pads, a test operation according to a data width option can be performed. That is, in accordance with the conventional art, the positive/negative data strobe signals are applied to the first and second pads to perform a test operation, and then the positive/negative data strobe signals are applied to the third and fourth pads to perform the test operation in order to perform the x8 data width option. On the other hand, in the semiconductor device according to the present invention, even when the positive/negative data strobe signals are applied to one pair of the first and second pads 310_1 and 310_2, and the third and fourth pads 310_3 and 310_4, the test operation corresponding to the x8 data width option can be performed. Therefore, the operation efficiency of an operator performing the test can be increased.

In accordance with the present invention, even when the number of data strobe signals used during a normal operation increases, a desired test operation is performed using a minimum number of test pins, so that the taken time for a test is reduced and thus the product price can be reduced.

Also, since data strobe signals are received using a predetermined pad during a test operation to perform the test operation according to a data width option, test efficiency can be increased.

While the present invention has been described with respect to the specific embodiments, it will be apparent to those skilled in the art that various changes and modifications may be made without departing from the spirit and scope of the invention as defined in the following claims.

For example, though the above-described embodiment has been described by way of example for a case of designing a pair of pads receiving positive/negative data strobe signals for eight data input/output pads, the present invention can be also applied to the design of a pair of pads for four data input/output pads, for example.

Also, though the above-described embodiment has been described using data strobe signals synchronizing data input/output as an example, the present invention can be applied to not only data strobe signals but also a plurality of signals having the same characteristic applied through a plurality of pads. That is, during the test operation, one signal representing a plurality of signals is applied through a minimum number of pads, and the signal is shared, so that the test operation can be performed.

In the above embodiments, the locations and types of the logic gates and transistors may be differently modified according to the polarities of the input signals.

What is claimed is:

1. A semiconductor device, comprising:
a pad configured to receive a data strobe signal; and
a path selector configured to output the data strobe signal through a corresponding input path during a normal operation, and to output the data strobe signal through a plurality of input paths in response to a path selection signal during a test operation.

2. The semiconductor device as recited in claim 1, wherein the plurality of input paths comprise the corresponding input path.

3. The semiconductor device as recited in claim 1, wherein the path selector comprises a plurality of transfer units configured to transfer the data strobe signal to the plurality of input paths in response to the path selection signal.

4. The semiconductor device as recited in claim 1, wherein the path selection signal comprises a signal corresponding to the test operation and the normal operation.

5. The semiconductor device as recited in claim 1, wherein the path selection signal comprises data width option information.

6. The semiconductor device as recited in claim 1, wherein the path selection signal comprises a signal provided by a mode register set.

7. A semiconductor device, comprising:
a first pad configured to receive a positive data strobe signal; and
a path selector configured to output the positive data strobe signal through a first positive input path during a normal operation, and to output the positive data strobe signal through the first positive input path, or through the first positive input path and a second positive input path in response to a path selection signal during a test operation.

8. The semiconductor device as recited in claim 7, wherein the path selector comprises a transfer unit configured to output the positive data strobe signal through the second positive input path in response to the path selection signal.

9. The semiconductor device as recited in claim 7, further comprising a second pad configured to receive a negative data strobe signal corresponding to the positive data strobe signal.

10. The semiconductor device as recited in claim 9, further comprising first and second differential input buffers configured to receive and buffer a differential positive data strobe signal and a differential negative data strobe signal to generate positive/negative input signals corresponding to the respective positive and negative data strobe signals.

11. The semiconductor device as recited in claim 10, wherein the path selector comprises:
a first transfer unit configured to transfer the positive input signal to the second positive input path in response to the path selection signal; and
a second transfer unit configured to transfer the negative input signal to a second negative input path corresponding to the second positive input path in response to the path selection signal.

12. The semiconductor device as recited in claim 10, wherein the positive input signal is output through the first positive input path, and the negative input signal is output through a first negative input path corresponding to the first positive input path.

13. The semiconductor device as recited in claim 12, further comprising:
a third transfer unit configured to transfer the positive input signal to the first positive input path in response to the path selection signal; and
a fourth transfer unit configured to transfer the negative input signal to the first negative input path in response to the path selection signal.

14. The semiconductor device as recited in claim 7, wherein the path selection signal comprises a signal corresponding to the test operation and the normal operation.

15. The semiconductor device as recited in claim 7, wherein the path selection signal comprises data width option information.

16. The semiconductor device as recited in claim 7, wherein the path selection signal comprises a signal provided by a mode register set.

17. A semiconductor device, comprising:
a first pad configured to receive a first positive data strobe signal;
a second pad configured to receive a second positive data strobe signal; and
a path selector configured to output the first and second data strobe signals through first and second input paths during a normal operation, and selectively output the first or second data strobe signal through first or second positive input paths, or output the first and second data strobe signals through the first and second positive input paths in response to first and second path selection signals during a test operation.

18. The semiconductor device as recited in claim 17, wherein the path selector comprises:
a first multiplexer configured to output the first or second positive data strobe signal through the first positive input path in response to the first path selection signal; and
a second multiplexer configured to output the first or second positive data strobe signal through the second positive input path in response to the second path selection signal.

19. The semiconductor device as recited in claim 18, wherein each of the first and second multiplexers comprises a plurality of transfer units each transferring the corresponding positive data strobe signal to the corresponding positive input path in response to the corresponding path selection signal.

20. The semiconductor device as recited in claim 17, further comprising:
a third pad configured to receive a first negative data strobe signal corresponding to the first positive data strobe signal; and
a fourth pad configured to receive a second negative data strobe signal corresponding to the second positive data strobe signal.

21. The semiconductor device as recited in claim 20, further comprising:
first and second differential input buffers configured to receive and buffer a differential first positive data strobe signal and a differential first negative data strobe signal to generate first positive/negative input signals corresponding to the respective input data strobe signals; and
third and fourth differential input buffers configured to receive and buffer a differential second positive data strobe signal and a differential second negative data strobe signal to generate second positive/negative input signals corresponding to the respective input data strobe signals.

22. The semiconductor device as recited in claim 21, wherein the path selector comprises:
a first multiplexer configured to output the first or second positive input signal through the first positive input path in response to the first path selection signal;
a second multiplexer configured to output the first or second negative input signal through a first negative input path corresponding to the first positive input path in response to the first path selection signal;
a third multiplexer configured to output the first or second positive input signal through the second positive input path in response to the second path selection signal; and
a fourth multiplexer configured to output the first or second negative input signal through a second negative input path corresponding to the second positive input path in response to the second path selection signal.

23. The semiconductor device as recited in claim 22, wherein each of the first to fourth multiplexers comprises a plurality of transfer units configured to transfer the corresponding input signal to the corresponding input path in response to the corresponding path selection signal.

24. The semiconductor device as recited in claim 17, wherein the path selection signal comprises a signal corresponding to the test operation and the normal operation.

25. The semiconductor device as recited in claim 17, wherein the path selection signal comprises data width option information.

26. The semiconductor device as recited in claim 17, wherein the path selection signal comprises a signal provided by a mode register set.

27. A method for operating a semiconductor device, the method comprising:

outputting a data strobe signal applied to a pad through a corresponding input path during a normal operation; and sharing the data strobe signal applied to the pad with a plurality of input paths in response to a path selection signal during a test operation.

28. The method as recited in claim 27, wherein the plurality of input paths comprise the corresponding input path.

29. The method as recited in claim 27, wherein the data strobe signal comprises a positive data strobe signal and a corresponding negative data strobe signal.

30. The method as recited in claim 29, further comprising receiving and buffering a differential positive data strobe signal and a differential negative data strobe signal.

31. The method as recited in claim 27, wherein the sharing of the data strobe signal with the plurality of input paths comprises:

outputting the data strobe signal through a first input path in response to the path selection signal; and outputting the data strobe signal through a second input path in response to the path selection signal.

32. The method as recited in claim 31, wherein the data strobe signal is output through the first or second input path, or through the first and second input paths according to the path selection signal.

33. The method as recited in claim 27, wherein the path selection signal comprises a signal corresponding to the test operation and the normal operation.

34. The method as recited in claim 27, wherein the path selection signal comprises data width option information.

* * * * *